US010657918B2

(12) United States Patent
Li

(10) Patent No.: US 10,657,918 B2
(45) Date of Patent: May 19, 2020

(54) GATE DRIVING CIRCUIT AND DISPLAY DEVICE

(71) Applicant: Wuhan China Star Optoelectronics Technology Co., Ltd., Wuhan, Hubei (CN)

(72) Inventor: Yafeng Li, Wuhan (CN)

(73) Assignee: WUHAN CHINA STAR OPTOELECTRONICS TECHNOLOGY CO., LTD., Wuhan (CN)

(*) Notice: Subject to any disclaimer, the term of this patent is extended or adjusted under 35 U.S.C. 154(b) by 342 days.

(21) Appl. No.: 15/327,303

(22) PCT Filed: Dec. 30, 2016

(86) PCT No.: PCT/CN2016/113412
§ 371 (c)(1),
(2) Date: Sep. 14, 2017

(87) PCT Pub. No.: WO2018/119995
PCT Pub. Date: Jul. 5, 2018

(65) Prior Publication Data
US 2019/0385552 A1 Dec. 19, 2019

(30) Foreign Application Priority Data
Dec. 27, 2016 (CN) .......................... 2016 1 1226511

(51) Int. Cl.
*G09G 3/36* (2006.01)
(52) U.S. Cl.
CPC ....... *G09G 3/3677* (2013.01); *G09G 2310/08* (2013.01)

(58) Field of Classification Search
CPC combination set(s) only.
See application file for complete search history.

(56) References Cited

U.S. PATENT DOCUMENTS

2016/0253976 A1* 9/2016 Jang ..................... G09G 3/3677
345/208

FOREIGN PATENT DOCUMENTS

| CN | 101937718 A | 1/2011 |
| CN | 103680450 A | 3/2014 |
| CN | 104091577 A | 10/2014 |
| CN | 104103244 A | 10/2014 |

(Continued)

OTHER PUBLICATIONS

Chinese Office Action for related Chinese Application No. 201611226511.0; action dated Aug. 23, 2018; (4 pages).

(Continued)

*Primary Examiner* — Robin J Mishler

(57) ABSTRACT

Disclosed is a gate driving circuit and a display device, which belongs to the technical field of displaying, and resolves a technical problem that a signal transmitted between cascaded gate driving circuits is easily attenuated in the prior art. The gate driving circuit includes a precharging unit circuit, an output unit circuit, and a compensation charging unit circuit; the output unit circuit includes a first reference point and a first clock signal line; and the precharging unit circuit is configured to input a high level to the first reference point before an output period.

15 Claims, 3 Drawing Sheets

(56) References Cited

FOREIGN PATENT DOCUMENTS

| | | |
|---|---|---|
| CN | 105976751 A | 9/2016 |
| JP | 2012215899 A | 11/2012 |

OTHER PUBLICATIONS

International Search Report and Written Opinion for related International Application No. PCT/CN2016/113412; report dated Sep. 22, 2017; (12 pages).

* cited by examiner

GATE DRIVING CIRCUIT AND DISPLAY DEVICE

CROSS-REFERENCE TO RELATED APPLICATIONS

The present application claims the priority of Chinese patent application CN 201611226511.0, entitled "Gate driving circuit and display device" and filed on Dec. 27, 2016, the entirety of which is incorporated herein by reference.

FIELD OF THE INVENTION

The present disclosure relates to the technical field of displaying, and specifically, to a gate driving circuit and a display device.

BACKGROUND OF THE INVENTION

With development of displaying technologies, a liquid crystal display screen has been a most common display device. The liquid crystal display screen has superior characteristics of high space utilization, low consumption, no radiation, and low electromagnetic interference. Therefore, the liquid crystal display screen is widely used in information communication tools such as a television, a mobile phone, or a panel computer.

Currently, a Gate Driver On Array (GOA) technology is more widely applied to a liquid crystal display device, that is, a gate driving circuit of a scanning line is manufactured on an array substrate by using an existing thin-film transistor procedure, so as to implement drive of the scanning line for scanning line by line.

As shown in FIG. 1 and FIG. 2, in order to ensure stability of an output point Gn of the scanning line, two reference points Q, P are introduced into an existing GOA gate driving circuit, and the two points Q, P are of a mutual dependence relationship. When Gn outputs a high-level scanning signal, Gn needs to be in a low-level stable phase. When a clock signal CKV3 is of a high level, a high-level signal line VGH charges the point P to a high level, and maintains the high level of the point P by using a capacitor C2. When the point P is in a high level, T4 and T5 are both in a conductive state so as to ensure stability of the low level of Gn and the point Q. However, when a quantity of cascaded gate driving circuits continuously increases, a signal transmitted between the cascaded gate driving circuits is attenuated. Once the signal is attenuated, precharging capability of a point Q in a particular stage is decreased, and a voltage on the point Q is decreased. As a result, output capability of a current-stage Gn is reduced, thus affecting charging of a pixel electrode in a display panel.

SUMMARY OF THE INVENTION

An objective of the present disclosure is to provide a gate driving circuit and a display device, so as to resolve a technical problem that a signal transmitted between cascaded driving circuits is easily attenuated in the prior art.

The present disclosure provides a gate driving circuit, including a precharging unit circuit, an output unit circuit, and a compensation charging unit circuit. The output unit circuit includes a first reference point and a first clock signal line. The precharging unit circuit is configured to input a high level to the first reference point before an output period. The first reference point maintains the high level during the output period; meanwhile, the first clock signal line outputs a high level, so that the output unit circuit outputs a scanning signal to a scanning line. The compensation charging unit circuit is configured to input a compensation voltage to the first reference point during a previous period and a next period of the output period, so as to maintain the high level of the first reference point.

Preferably, the precharging unit circuit includes a first switch tube and a high-level signal line. A gate of the first switch tube is connected to a previous-stage scanning line, a source thereof is connected to the high-level signal line, and a drain thereof is connected to the first reference point.

Further, the precharging unit circuit further includes a second switch tube. A gate of the second switch tube is connected to a next-stage scanning line, a source thereof is connected to the high-level signal line, and a drain thereof is connected to the first reference point.

Further, the output unit circuit also includes a third switch tube and a first capacitor. A gate of the third switch tube is connected to the first reference point, a source thereof is connected to the clock signal line, and a drain thereof is connected to the scanning line. The first capacitor is connected between the gate and the drain of the third switch tube.

Preferably, the gate driving circuit further includes a holding unit circuit, and the holding unit circuit comprises a second reference point, a low-level signal line, a fourth switch tube, and a second capacitor. A gate of the fourth switch tube is connected to the second reference point, a source thereof is connected to the low-level signal line, and a drain thereof is connected to the scanning line. The second capacitor is connected between the second reference point and the low-level signal line.

Further, the holding unit circuit also includes a fifth switch tube and a sixth switch tube. A gate of the fifth switch tube is connected to the second reference point, a source thereof is connected to the first reference point, and a drain thereof is connected to the low-level signal line. A gate of the sixth switch tube is connected to the first reference point, a source thereof is connected to the second reference point, and a drain thereof is connected to the low-level signal line.

Further, the holding unit circuit also includes a high-level signal line, a second clock signal line, and a seventh switch tube. A gate of the seventh switch tube is connected to the second clock signal line, a source thereof is connected to the high-level signal line, and a drain thereof is connected to the second reference point.

Preferably, the compensation charging unit circuit includes a high-level signal line, an eighth switch tube, and a ninth switch tube. A gate of the eighth switch tube is connected to a first reference point corresponding to a previous-row scanning line, and a source thereof is connected to the high-level signal line. A gate of the ninth switch tube is connected to a first reference point corresponding to a next-row scanning line, and a drain thereof is connected to the first reference point. A drain of the eighth switch tube is connected to the source of the ninth switch tube.

The present disclosure further provides a display device, including a plurality of cascaded gate driving circuits.

Preferably, the display device includes an array substrate, and the gate driving circuits are formed on the array substrate.

The present disclosure has the following beneficial effects. The gate driving circuit provided by the present disclosure includes a precharging unit circuit, an output unit circuit, and a compensation charging unit circuit. Before an output period, the precharging unit circuit inputs a high level to the first reference point in the output unit circuit. The first reference point maintains the high level during the output period; meanwhile, the first clock signal line in the output unit circuit outputs a high level, so that the output unit circuit outputs a scanning signal to a scanning line. In addition, the compensation charging unit circuit may input a compensation voltage to the first reference point during a previous period and a next period of the output period, so as to maintain the high level of the first reference point, thus ensuring that charging capability of the first reference point is not affected during transmission between multiple stages of cascaded gate driving circuits, and keeping stability of a voltage of the first reference point, so as to resolve a technical problem that a signal transmitted between the cascaded gate driving circuits is easily attenuated in the prior art.

Other features and advantages of the present disclosure will be further explained in the following description, and partly become self-evident therefrom, or be understood through implementation of the present disclosure. The objectives and advantages of the present disclosure will be achieved through the structure specifically pointed out in the description, claims, and the accompanying drawings.

BRIEF DESCRIPTION OF THE DRAWINGS

In order to illustrate the technical solutions in embodiments of the present disclosure more clearly, drawings required for the description of the embodiments are simply introduced in the following. In the drawings.

DETAILED DESCRIPTION OF THE EMBODIMENTS

Embodiments of the present disclosure will be further explained in detail in conjunction with the accompanying drawings and embodiments. Based on this, an implementation process of how the present disclosure resolves a technical problem by applying technical means and achieves technical effects can be fully understood and can be implemented accordingly. It should be illustrated that embodiments in the present disclosure and features in the embodiments can be combined with each other without forming conflicts, and formed technical solutions are within the protection scope of the present disclosure.

Embodiment 1

Figure 1:
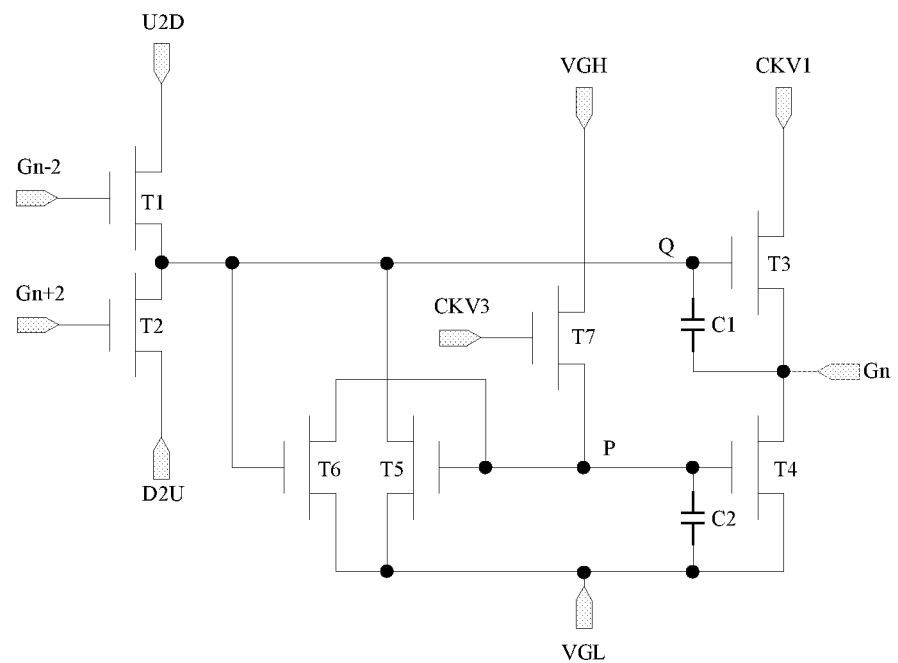
FIG. 1 schematically shows an existing gate driving circuit.
Figure 2:
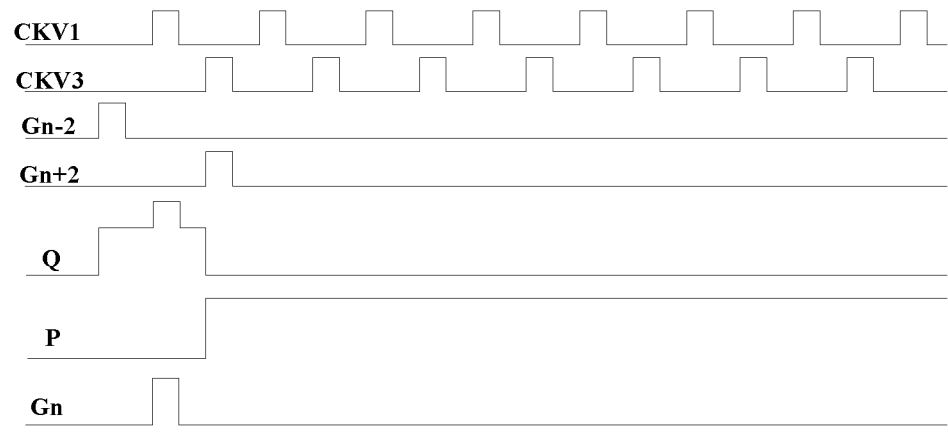
FIG. 2 shows a timing sequence diagram of the existing gate driving circuit.
Figure 3:
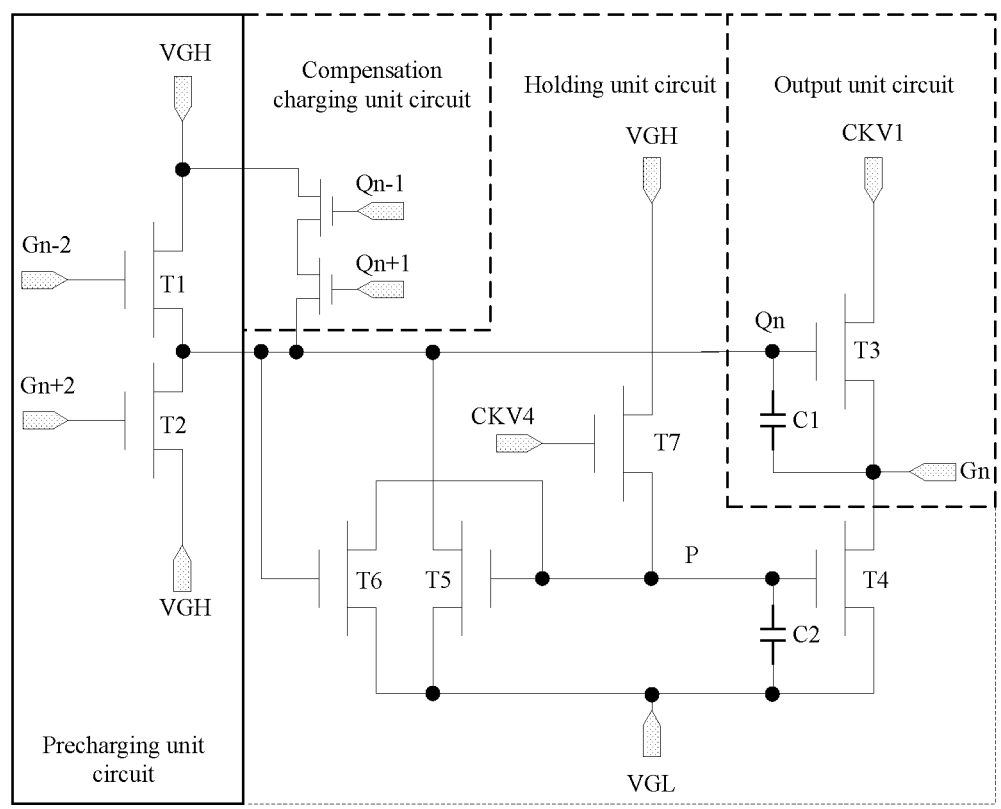
FIG. 3 schematically shows a gate driving circuit according to Embodiment 1 of the present disclosure.

As shown in FIG. 3, this embodiment of the present disclosure provides a gate driving circuit including a precharging unit circuit, an output unit circuit, and a compensation charging unit circuit. The output unit circuit includes a first reference point Qn and a first clock signal line CKV1.

Before an output period, the precharging unit circuit inputs a high level to the first reference point Qn. The first reference point Qn maintains the high level during the output period; meanwhile, the first clock signal line CKV1 outputs a high level, so that the output unit circuit outputs a scanning signal to a scanning line Gn. The output period refers to a scanning period for a scanning line Gn controlled by a current-stage gate driving circuit to output a scanning signal.

In this embodiment, the precharging unit circuit may specifically include a first switch tube T1 and a high-level signal line VGH. A gate of the first switch tube T1 is connected to a previous-stage scanning line Gn−2, a source thereof is connected to the high-level signal line VGH, and a drain thereof is connected to the first reference point Qn. When the previous-stage scanning line Gn−2 outputs a scanning signal, the first switch tube T1 can be turned on, so as to precharge the output unit circuit by using the first switch tube T1 via the high-level signal line VGH.

The precharging unit circuit may further include a second switch tube T2. A gate of the second switch tube T2 is connected to a next-stage scanning line Gn+2, a source thereof is connected to the high-level signal line VGH, and a drain thereof is connected to the first reference point Qn. When the next-stage scanning line Gn+2 outputs a scanning signal, precharging can be performed on the output unit circuit by using the second switch tube T2, so as to implement bidirectional scanning.

It can be seen that in this embodiment, cascaded gate driving circuits are disposed on both sides. Cascaded gate driving circuit on one side are configured to drive scanning lines of all odd rows, and gate driving circuits on the other side are configured to drive scanning lines of all even rows. Therefore, on one of the two sides, there are two rows between a scanning line Gn and a previous-stage scanning line Gn−2, and there are also two rows between the scanning line Gn and a scanning line Gn+2.

Further, the output unit circuit further includes a third switch tube T3 and a first capacitor C1. A gate of the third switch tube T3 is connected to the first reference point Qn, a source thereof is connected to the clock signal line CKV1, and a drain thereof is connected to the scanning line Gn. The first capacitor is connected between the gate and the drain of the third switch tube T3.

As a preferable solution, the gate driving circuit provided by this embodiment of the present disclosure further includes a holding unit circuit configured to maintain the first reference point Qn in a low level after an output period.

In this embodiment, the holding unit circuit may specifically include a second reference point P, a low-level signal line VGL, a fourth switch tube T4, and a second capacitor C2. A gate of the fourth switch tube T4 is connected to the second reference point P, a source thereof is connected to the low-level signal line VGL, and a drain thereof is connected to the scanning line Gn. The second capacitor C2 is connected between the second reference point P and the low-level signal line VGL.

In this embodiment, the holding unit circuit further includes a fifth switch tube T5 and a sixth switch tube T6. A gate of the fifth switch tube T5 is connected to the second reference point P, a source thereof is connected to the first reference point Qn, and a drain thereof is connected to the low-level signal line VGL. A gate of the sixth switch tube T6 is connected to the first reference point Qn, a source thereof is connected to the second reference point P, and a drain thereof is connected to the low-level signal line VGL.

Further, the holding unit circuit further includes a high-level signal line VGH, a second clock signal line CKV4, and a seventh switch tube T7. A gate of the seventh switch tube T7 is connected to the second clock signal line CKV4, a source thereof is connected to the high-level signal line VGH, and a drain thereof is connected to the second reference point P. When the second clock signal line CKV4 is of a high level, the seventh switch tube T7 is in a conductive state. The high-level signal line VGH charges the second reference point P to a high level to turn on the fifth switch tube T5, so as to lower an electric potential of the first reference point Qn. Meanwhile, the second capacitor C2 can maintain the high level of the second reference point P.

The compensation charging unit circuit in this embodiment specifically includes a high-level signal line VGH, an eighth switch tube T8, and a ninth switch tube T9. A gate of the eighth switch tube T8 is connected to a first reference point Qn−1 corresponding to a previous-row scanning line, and a source thereof is connected to the high-level signal line VGH. A gate of the ninth switch tube T9 is connected to a first reference point Qn+1 corresponding to a next-row scanning line, and a drain thereof is connected to the first reference point Qn. A drain of the eighth switch tube T8 is connected to the source of the ninth switch tube T9.

When the first reference point Qn+1 corresponding to the previous-row scanning line and the first reference point Qn−1 corresponding to the next-row scanning line are both of high levels, the eighth switch tube T8 and the ninth switch tube T9 are turned on at the same time, that is, the high-level signal line VGH can be used to perform compensated charging on the first reference point Qn.

Figure 4:
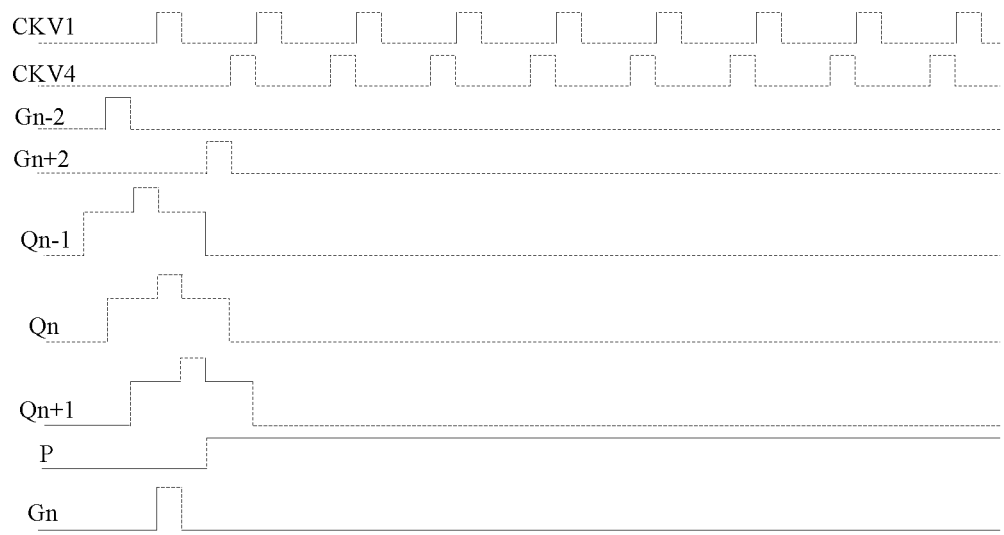
FIG. 4 shows a timing sequence diagram of the gate driving circuit according to Embodiment 1 of the present disclosure.

As shown in FIG. 3 and FIG. 4, a working process of the gate driving circuit provided by this embodiment of the present disclosure includes the following stages.

Stage 1: Precharging

An example of forward direction scanning is used in this embodiment for illustration. Gn−2 outputs a scanning signal of a high level, T1 is conductive, and the point Qn is precharged to a high level. Meanwhile, Qn+1 and Qn−1 are both of high levels, and T8 and T9 are turned on at the same time, that is, VGH can be used to perform compensated charging on the point Qn.

Stage 2: Outputting a High Level by Gn

In stage 1, the point Qn is precharged to a high level, and C1 can maintain the high level of the point Qn to keep T3 to be in a conductive state. Meanwhile, the high level of CKV1 is output to Gn through T3, so as to enable Gn to output a scanning signal. In addition, T6 is turned on at this time to maintain the point P in a low level.

Stage 3: Outputting a Low Level by Gn

Gn+2 outputs a high level, T2 is turned on, and the point Qn maintains the high level. At this time, the low level of CKV1 is output to Gn through T3, so as to enable Gn to output the low level. Meanwhile, Qn+1 and Qn−1 are both of high levels, and T8 and T9 are turned on at the same time, that is, VGH can be used to perform compensated charging on the point Qn.

Stage 4: Pulling the Point Qn Down to a Low Level

When CKV4 is of a high level, T7 is in a conductive state so as to enable the point P to be in a high level. At this time, T5 is turned on, and the point Qn is pulled down to cut off T3. Meanwhile, T4 is turned on and Gn is not pulled down.

Stage 5. Maintaining the Point Qn and the Point Gn in High Levels

When the point Qn is pulled down to a low level, T6 is in a cut-off state. When CKV4 is of a high level, T7 is turned on, and the point P is charged so as to keep T4 and T5 both in a conductive state, thereby ensuring stability of low levels of the point Qn and the point Gn. Meanwhile, C2 has a particular holding function on the high level of the point P.

In the gate driving circuit provided by this embodiment of the present disclosure, T8 and T9 are provided so as to charge compensated voltages to the point Qn during a previous period and a next period of the output period, so as to maintain a high level of the point Qn. During transmission between the multiple stages of cascaded gate driving circuits, it can be ensured that charging capability of the point Qn is not affected and a voltage on the point Qn is kept stable, so as to resolve a technical problem that a signal transmitted between the cascaded gate driving circuits is easily attenuated in the prior art.

Embodiment 2

This embodiment of the present disclosure provides a gate driving circuit, and a circuit structure thereof is the same as that in Embodiment 1.

Figure 5:
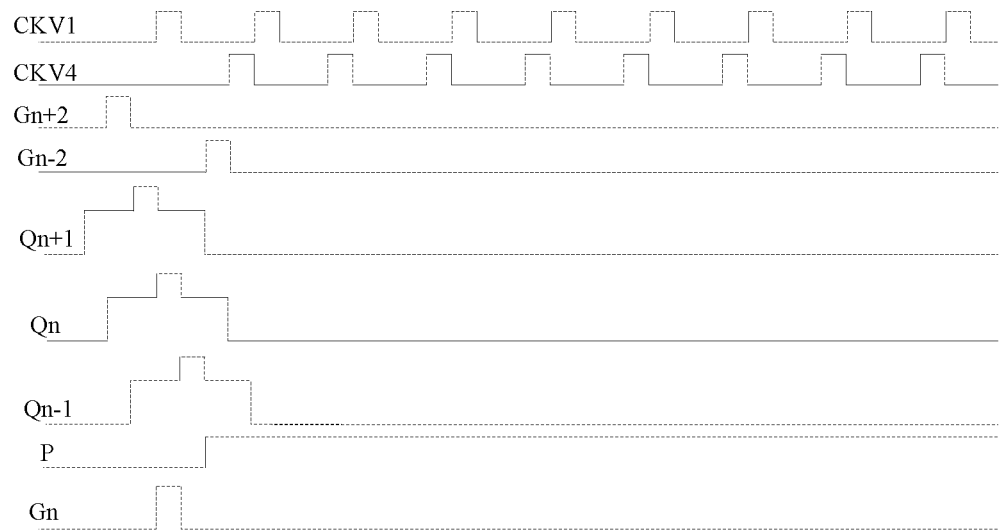
FIG. 5 shows a timing sequence diagram of a gate driving circuit according to Embodiment 2 of the present disclosure.

As shown in FIG. 3 and FIG. 5, an example of reverse direction scanning is used in this embodiment for illustration, and a working process of the gate driving circuit includes the following stages.

Stage 1: Precharging

Gn+2 outputs a scanning signal of a high level, T1 is turned on, and the point Qn is precharged to a high level. Meanwhile, Qn+1 and Qn−1 are both of high levels, and T8 and T9 are turned on at the same time, that is, VGH can be used to perform compensated charging on the point Qn.

Stage 2: Outputting a High Level by Gn

In stage 1, the point Qn is precharged to a high level, and C1 can maintain the high level of the point Qn to keep T3 in a conductive state. Meanwhile, the high level of CKV1 is output to Gn through T3, so as to enable Gn to output a scanning signal.

In addition, T6 is turned on at this time to maintain the point P in a low level.

Stage 3: Outputting a Low Level by Gn

Gn−2 outputs a high level, T2 is turned on, and the point Qn maintains the high level. At this time, the low level of CKV1 is output to Gn through T3, so as to enable Gn to output the low level. Meanwhile, Qn+1 and Qn−1 are both of high levels, and T8 and T9 are conductive at the same time, that is, VGH can be used to perform compensated charging on the point Qn.

Stage 4: Pulling the Point Qn Down to a Low Level

When CKV4 is of a high level, T7 is in a conductive state so as to enable the point P to be in a high level. At this time, T5 is turned on, and the point Qn is pulled down to cut off T3. Meanwhile, T4 is turned on and Gn is not pulled down.

Stage 5: Maintaining the Point Qn and the Point Gn in High Levels

When the point Qn is pulled down to a low level, T6 is in a cut-off state. When CKV4 is of a high level, T7 is turned on, and the point P is charged so as to turn on T4 and T5, thereby ensuring stability of low levels of the point Qn and the point Gn. Meanwhile, C2 has a particular holding function on the high level of the point P.

In the gate driving circuit provided by this embodiment of the present disclosure, T8 and T9 are provided so as to charge compensated voltages to the point Qn during a previous period and a next period of the output period, so as to maintain a high level of the point Qn. During transmission between the multiple stages of cascaded gate driving circuits, it can be ensured that charging capability of the point Qn is not affected and a voltage of the point Qn is kept stable, so as to resolve a technical problem that a signal transmitted between the cascaded gate driving circuits is easily attenuated in the prior art.

Embodiment 3

The present disclosure provides a display device, which includes multiple cascaded gate driving circuits provided in the foregoing two embodiments.

The display device provided by this embodiment of the present disclosure includes an array substrate. The gate driving circuit is formed on the array substrate. That is, a GOA technology is used to manufacture the gate driving circuit on a half area of the array substrate.

The display device provided by this embodiment of the present disclosure has the same technical feature as the gate driving circuits provided by Embodiment 1 and Embodiment 2, can solve the same technical problem, and can achieve the same technical effects.

Although the implementation manners disclosed by the present disclosure are described as above, the content is merely implementation manners used to facilitate understanding of the present disclosure, and is not to limit the present disclosure. Without departing from the spirit and scope disclosed in the present disclosure, any modifications and changes in implementation forms and details can be made by any person skilled in the art to which the present disclosure belongs. However, the patent protection scope of the present disclosure should be subject to the scope defined in the claims.

The invention claimed is:

1. A gate driving circuit, comprising a precharging unit circuit, an output unit circuit, and a compensation charging unit circuit,
   wherein the output unit circuit comprises a first reference point Qn corresponding to a current-row scanning line and a first clock signal line;
   wherein the precharging unit circuit is configured to input a high level to the first reference point Qn before an output period;
   wherein the first reference point Qn maintains the high level during the output period, and meanwhile the first clock signal line outputs a high level, so that the output unit circuit outputs a scanning signal to the current-row scanning line; and
   wherein the compensation charging unit circuit is configured to input a compensation voltage to the first reference point Qn during a previous period and a next period of the output period, so as to maintain the high level of the first reference point On;
      wherein the compensation charging unit circuit comprises a high-level signal line, an eighth switch tube, and a ninth switch tube, wherein a gate of the eighth switch tube is connected to a first reference point Qn−1 corresponding to a previous-row scanning line, and a source thereof is connected to the high-level signal line; a gate of the ninth switch tube is connected to a first reference point Qn+1 corresponding to a next-row scanning line, and a drain thereof is connected to the first reference point Qn; and a drain of the eighth switch tube is connected to the source of the ninth switch tube.

2. The gate driving circuit according to claim 1, wherein the precharging unit circuit comprises a first switch tube and the high-level signal line,
   wherein a gate of the first switch tube is connected to a previous-stage scanning line, a source thereof is connected to the high-level signal line, and a drain thereof is connected to the first reference point Qn.

3. The gate driving circuit according to claim 2, wherein the precharging unit circuit further comprises a second switch tube,
   wherein a gate of the second switch tube is connected to a next-stage scanning line, a source thereof is connected to the high-level signal line, and a drain thereof is connected to the first reference point Qn.

4. The gate driving circuit according to claim 1, wherein the output unit circuit further comprises a third switch tube and a first capacitor,
   wherein a gate of the third switch tube is connected to the first reference point Qn, a source thereof is connected to the clock signal line, and a drain thereof is connected to the current-row scanning line; and
   wherein the first capacitor is connected between the gate and the drain of the third switch tube.

5. The gate driving circuit according to claim 1, further comprising a holding unit circuit, wherein the holding unit circuit comprises a second reference point P, a low-level signal line, a fourth switch tube, and a second capacitor,
   wherein a gate of the fourth switch tube is connected to the second reference point P, a source thereof is connected to the low-level signal line, and a drain thereof is connected to the current-row scanning line; and
   wherein the second capacitor is connected between the second reference point and the low-level signal line.

6. The gate driving circuit according to claim 5, wherein the holding unit circuit further comprises a fifth switch tube and a sixth switch tube,
   wherein a gate of the fifth switch tube is connected to the second reference point P, a source thereof is connected to the first reference point Qn, and a drain thereof is connected to the low-level signal line; and
   wherein a gate of the sixth switch tube is connected to the first reference point Qn, a source thereof is connected to the second reference point P, and a drain thereof is connected to the low-level signal line.

7. The gate driving circuit according to claim 6, wherein the holding unit circuit further comprises the high-level signal line, a second clock signal line, and a seventh switch tube,
   wherein a gate of the seventh switch tube is connected to the second clock signal line, a source thereof is connected to the high-level signal line, and a drain thereof is connected to the second reference point P.

8. A display device, comprising a plurality of cascaded gate driving circuits, wherein a $n^{th}$ gate driving circuit comprises a precharging unit circuit, an output unit circuit, and a compensation charging unit circuit,
   wherein the output unit circuit comprises a first reference point Qn corresponding to a current-row scanning line and a first clock signal line;
   wherein the precharging unit circuit is configured to input a high level to the first reference point Qn before an output period;
   wherein the first reference point Qn maintains the high level during the output period, and meanwhile the first clock signal line outputs a high level, so that the output unit circuit outputs a scanning signal to the current-row scanning line; and
   wherein the compensation charging unit circuit is configured to input a compensation voltage to the first reference point Qn during a previous period and a next period of the output period, so as to maintain the high level of the first reference point On;
      wherein the compensation charging unit circuit comprises a high-level signal line, an eighth switch tube, and a ninth switch tube, wherein a gate of the eighth switch tube is connected to a first reference point Qn−1 corresponding to a previous-row scanning line, and a source thereof is connected to the high-level signal line; a gate of the ninth switch tube is connected to a first reference point Qn+1 corresponding to a next-row scanning line, and a drain thereof is connected to the first reference point Qn; and a drain of the eighth switch tube is connected to the source of the ninth switch tube.

9. The display device according to claim 8, wherein the precharging unit circuit comprises a first switch tube and the high-level signal line,
wherein a gate of the first switch tube is connected to a previous-stage scanning line, a source thereof is connected to the high-level signal line, and a drain thereof is connected to the first reference point Qn.

10. The display device according to claim 9, wherein the precharging unit circuit further comprises a second switch tube,
wherein a gate of the second switch tube is connected to a next-stage scanning line, a source thereof is connected to the high-level signal line, and a drain thereof is connected to the first reference point Qn.

11. The display device according to claim 8, wherein the output unit circuit further comprises a third switch tube and a first capacitor;
wherein a gate of the third switch tube is connected to the first reference point Qn, a source thereof is connected to the clock signal line, and a drain thereof is connected to the current-row scanning line; and
wherein the first capacitor is connected between the gate and the drain of the third switch tube.

12. The display device according to claim 8, wherein the $n^{th}$ gate driving circuit further comprises a holding unit circuit, wherein the holding unit circuit comprises a second reference point P a low-level signal line, a fourth switch tube, and a second capacitor,
wherein a gate of the fourth switch tube is connected to the second reference point P a source thereof is connected to the low-level signal line, and a drain thereof is connected to the current-row scanning line; and
wherein the second capacitor is connected between the second reference point and the low-level signal line.

13. The display device according to claim 12, wherein the holding unit circuit further comprises a fifth switch tube and a sixth switch tube,
wherein a gate of the fifth switch tube is connected to the second reference point P, a source thereof is connected to the first reference point Qn, and a drain thereof is connected to the low-level signal line; and
wherein a gate of the sixth switch tube is connected to the first reference point Qn, a source thereof is connected to the second reference point P, and a drain thereof is connected to the low-level signal line.

14. The display device according to claim 13, wherein the holding unit circuit further comprises the high-level signal line, a second clock signal line, and a seventh switch tube,
wherein a gate of the seventh switch tube is connected to the second clock signal line, a source thereof is connected to the high-level signal line, and a drain thereof is connected to the second reference point P.

15. The display device according to claim 8, wherein the display device further comprises an array substrate, and the gate driving circuits are formed on the array substrate.

* * * * *